United States Patent
Houston et al.

(10) Patent No.: US 8,018,780 B2
(45) Date of Patent: Sep. 13, 2011

(54) TEMPERATURE DEPENDENT BACK-BIAS FOR A MEMORY ARRAY

(75) Inventors: Theodore W. Houston, Richardson, TX (US); Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 558 days.

(21) Appl. No.: 11/624,355

(22) Filed: Jan. 18, 2007

(65) Prior Publication Data

US 2008/0175068 A1 Jul. 24, 2008

(51) Int. Cl.
*G11C 11/34* (2006.01)
(52) U.S. Cl. ........... 365/185.27; 365/154; 365/211
(58) Field of Classification Search ........... 365/185.27, 365/154, 211, 156, 189.09, 185.24, 226, 365/228
See application file for complete search history.

(56) References Cited

U.S. PATENT DOCUMENTS

| 5,440,520 | A | * | 8/1995 | Schutz et al. | 365/226 |
|---|---|---|---|---|---|
| 6,172,611 | B1 | * | 1/2001 | Hussain et al. | 340/584 |
| 6,301,146 | B1 | * | 10/2001 | Ang et al. | 365/154 |
| 6,982,915 | B2 | * | 1/2006 | Houston et al. | 365/211 |
| 7,015,741 | B2 | * | 3/2006 | Tschanz et al. | 327/295 |
| 7,200,030 | B2 | * | 4/2007 | Yamaoka et al. | 365/154 |
| 7,362,646 | B2 | * | 4/2008 | Otsuka et al. | 365/226 |
| 2006/0133172 | A1 | * | 6/2006 | Schnabel et al. | 365/211 |
| 2007/0159874 | A1 | * | 7/2007 | Yamaoka et al. | 365/154 |
| 2007/0183185 | A1 | * | 8/2007 | Guo et al. | 365/156 |
| 2007/0242497 | A1 | * | 10/2007 | Joshi et al. | 365/154 |
| 2008/0094918 | A1 | * | 4/2008 | Fujizoe | 365/189.07 |

* cited by examiner

*Primary Examiner* — Dang Nguyen
(74) *Attorney, Agent, or Firm* — Rose Alyssa Keagy; Wade J. Brady, III; Frederick J. Telecky, Jr.

(57) ABSTRACT

The present invention provides a thermostatic bias controller for use with a memory array. The thermostatic bias controller includes a temperature sensing circuit configured to sense a temperature associated with the memory array. The thermostatic bias controller also includes a voltage control circuit coupled to the temperature sensing circuit and configured to provide a bias voltage to at least one back-gate of the memory array based on the temperature.

38 Claims, 6 Drawing Sheets

TEMPERATURE DEPENDENT BACK-BIAS FOR A MEMORY ARRAY

TECHNICAL FIELD OF THE INVENTION

The present invention is directed, in general, to semiconductor memory devices and, more specifically, to a thermostatic bias controller, a method of operating a thermostatic bias controller and a memory array employing the controller or the method.

BACKGROUND OF THE INVENTION

A static random access memory (SRAM) array employs a collection of cross-coupled CMOS inverters as memory elements having NMOS and PMOS transistors. Typically, the NMOS transistors are used as pull-down devices, and the PMOS transistors are used as pull-up devices. The NMOS transistors are contained in a p-substrate and the PMOS transistors are contained in an n-well within the p-substrate.

It is becoming increasingly difficult to have an SRAM design that is robust for the overall conditions in which it is required to operate. Two key parameters affecting this realm are the static noise margin (SNM), which is its robustness against upset and the trip voltage ($V_{trip}$), which provides a measure of the ability to write into the SRAM cell. The SRAM cell needs to provide a balance (i.e., maintain a level of robustness) between the two functions of reading and writing. Worst case for the SNM is high temperature while worst case for the $V_{trip}$ is low temperature. If there is a good balance between SNM and $V_{trip}$ at low temperature, there will be an imbalance at high temperature, generally.

The robustness may be measured in terms of the standard deviation SIGMA of local parameter variation within the SRAM cell. There are different parameters in a particular transistor that will vary randomly. The primary parameter is related to the doping employed to fabricate the transistor. Doping is done by an implantation process, which generates a somewhat Gaussian distribution of dopants per unit area. This causes parameter variation (primarily in the threshold voltage) from one transistor to the next on a local basis Local variations of transistor characteristics provide variation of the SNM such that there is a distribution of the SNM for local SRAM cells from one memory SRAM cell to the next memory SRAM cell. The memory cell SNM bears a linear relationship to the threshold voltage. Therefore, a Gaussian distribution of the threshold voltage provides a Gaussian distribution of the SNMs thereby allowing the local SIGMA of a particular cell to be considered. Since there are a large number of SRAM cells on a chip and there is no control over this local variation, a design margin is needed that accommodates the variation. Therefore, having a tolerance of five SIGMA worth of variation is deemed to provide reasonable robustness.

Figure of merit (FOM) is a measure of the robustness in terms of this local variation. A FOM of five indicates that there is adequate SNM over a five SIGMA range. Table 1 provides exemplary FOMs pertaining to SNM for two positive supply voltages and over three operating temperatures of a SRAM. Similarly, Table 2 provides exemplary FOMs pertaining to $V_{trip}$ for the same positive supply voltages and over the same operating temperatures of the SRAM. As a third variable, an n-well voltage $V_{nwell}$ is applied.

As may be seen in Tables 1 and 2 for any value of n-well voltage $V_{nwell}$, the FOMs for SNM decrease with increasing temperature, and the FOMs for $V_{trip}$ decrease with decreasing temperature. SNM is worst case at high temperature while $V_{trip}$ is worst case at low temperature, as noted above. Generally then, what improves SNM degrades $V_{trip}$ and vice-versa. It may also be noted that although the n-well voltages selected vary over a fairly wide margin, each value of $V_{nwell}$ produces a FOM that is less than five at some temperature within the normal operating range, which is typically −40 to +125 degrees C. Therefore, the design space for adequate SNM and adequate $V_{trip}$ is reduced by the required temperature range of operation.

TABLE 1

SRAM Cell SNM FOM Example

| | | SNM FOMs for $V_{nwell}$ equal to: | | | |
|---|---|---|---|---|---|
| $V_{DD}$ | TEMP | $V_{DD}$ − 0.5 V | $V_{DD}$ | $V_{DD}$ + 0.5 V | 1.8 V |
| 1.0 V | −40 C. | 7.6 | 7.3 | 6.9 | 6.7 |
| 1.0 V | 0 C. | 7.2 | 6.9 | 6.5 | 6.3 |
| 1.0 V | +125 C. | 5.6 | 5.2 | 4.8 | 4.6 |
| 1.3 V | −40 C. | 8.2 | 8.1 | 8.0 | 8.0 |
| 1.3 V | 0 C. | 7.5 | 7.4 | 7.2 | 7.2 |
| 1.3 V | 125 C. | 5.6 | 5.3 | 5.0 | 5.0 |

TABLE 2

SRAM Cell $V_{trip}$ FOM Example

| | | $V_{trip}$ FOMs for $V_{nwell}$ equal to: | | | |
|---|---|---|---|---|---|
| $V_{DD}$ | TEMP | $V_{DD}$ − 0.5 V | $V_{DD}$ | $V_{DD}$ + 0.5 V | 1.8 V |
| 1.0 V | −40 C. | 4.1 | 4.4 | 4.8 | 5 |
| 1.0 V | 0 C. | 4.6 | 4.9 | 5.4 | 5.6 |
| 1.0 V | +125 C. | 6.1 | 6.4 | 7.1 | 7.3 |
| 1.3 V | −40 C. | 7.3 | 7.7 | 8.1 | 8.1 |
| 1.3 V | 0 C. | 7.8 | 8.2 | 8.8 | 8.8 |
| 1.3 V | 125 C. | 9.4 | 10.0 | 10.7 | 10.7 |

Accordingly, what is needed in the art is a way to provide adequate SNM and $V_{trip}$ for a SRAM array over a broader operating temperature range.

SUMMARY OF THE INVENTION

To address the above-discussed deficiencies of the prior art, the present invention provides a thermostatic bias controller for use with a memory array. The thermostatic bias controller includes a temperature sensing circuit configured to sense a temperature associated with the memory array. The thermostatic bias controller also includes a voltage control circuit coupled to the temperature sensing circuit and configured to provide a bias voltage to at least one back-gate of the memory array based on the temperature.

In another aspect, the present invention provides a method of operating a thermostatic bias controller for use with a memory array. The method includes sensing a temperature associated with the memory array and providing a bias voltage to at least one back-gate of the memory array based on the temperature.

The present invention also provides, in yet another aspect, an integrated circuit. The integrated circuit includes a memory array employing at least one back-gate, and a thermostatic bias controller coupled to the at least one back-gate. The thermostatic bias controller has a temperature sensing circuit that senses a temperature associated with the memory array. The thermostatic bias controller also has a voltage control circuit, coupled to the temperature sensing circuit, that provides a bias voltage to the at least one back-gate of the memory array based on the temperature. The integrated circuit also includes a memory control portion that provides read/write access for the memory array.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
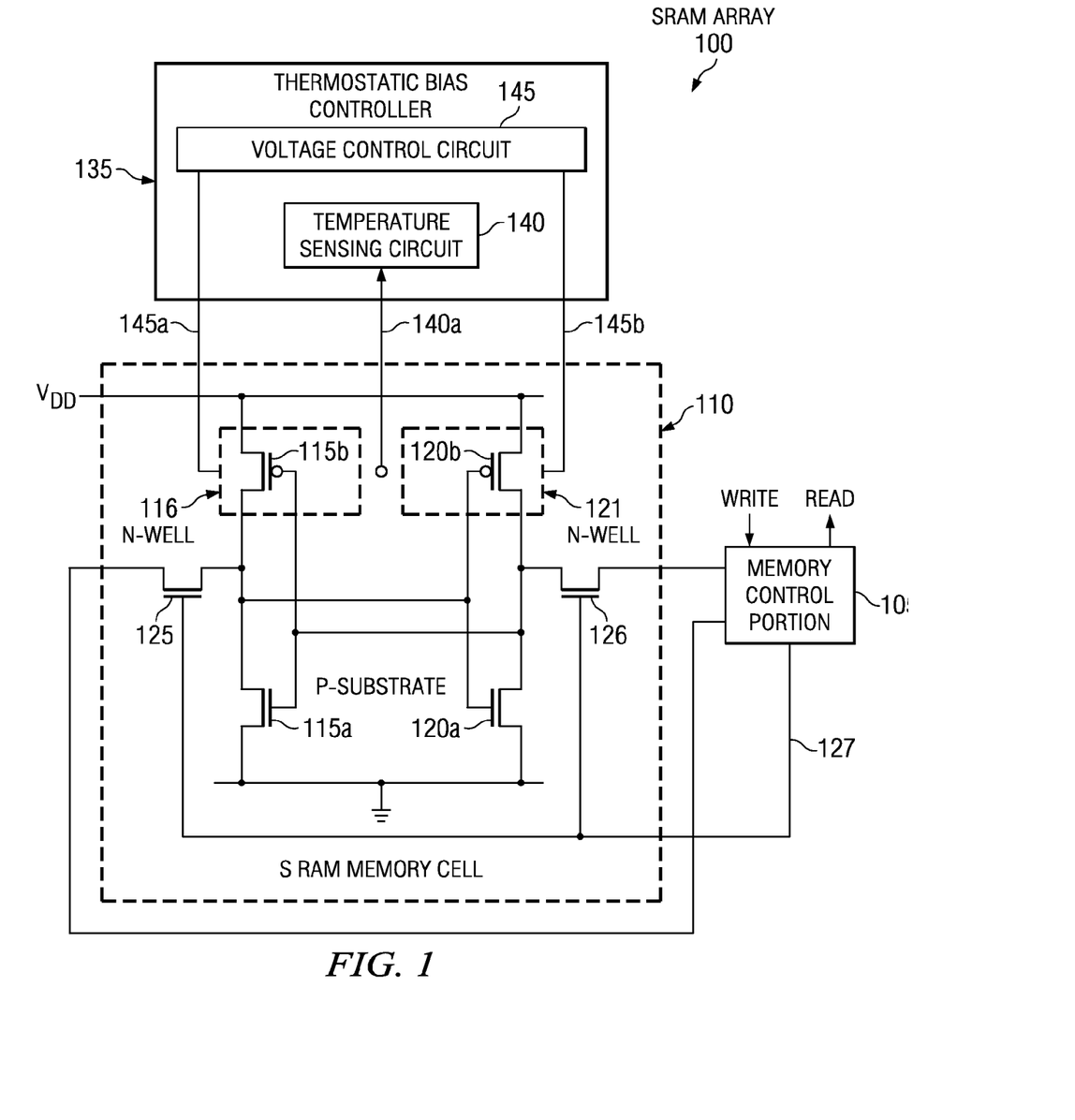
FIG. 1 illustrates an embodiment of an integrated circuit constructed according to the principles of the present invention.

FIG. 1 illustrates an embodiment of an integrated circuit 100 constructed according to the principles of the present invention. The integrated circuit 100 includes a memory array, which is an SRAM array in the illustrated embodiment. The SRAM array has a plurality of SRAM memory cells, wherein a SRAM memory cell 110 is typical, that are coupled to a memory control portion 105. The memory control portion 105 provides read/write access for the SRAM array. The SRAM memory cell 110 consists of first and second CMOS inverters 115a/115b and 120a/120b that are cross-coupled to form a memory element, as shown. First and second NMOS transistors 115a, 120a operate as pull-down transistors, and first and second PMOS transistors 115b, 120b operate as pull-up transistors. The SRAM memory cell 110 also includes first and second n-wells 116, 121 that contain the first and second PMOS transistors 115b, 120b and are formed in a p-substrate containing the first and second NMOS transistors 115a, 120a. The SRAM memory cell 110 is coupled to the control portion 105 by first and second NMOS pass gate transistors 125, 126 that employ a control line 127. Of course, one skilled in the pertinent art recognizes that employing an embodiment of an SRAM array having complementary polarities to those shown in FIG. 1 are well within the scope of the present invention, as well.

The integrated circuit 100 also includes a thermostatic bias controller 135 having a temperature sensing circuit 140 and a voltage control circuit 145. The temperature sensing circuit 140 employs a temperature contact 140a to sense a temperature of the SRAM array. The voltage control circuit 145 is coupled to the temperature sensing circuit 140 and employs first and second biasing contacts 145a, 145b to provide a bias voltage to the first and second n-wells 116, 121 based on the temperature of the SRAM array. The first and second n-wells 116, 121 form back-gates for the first and second PMOS transistors 115b, 120b, respectively.

In the illustrated embodiment, separate n-wells are employed, as shown. However, alternative embodiments may employ a common n-well for the first and second PMOS transistors 115b, 120b. Of course, alternative embodiments of the present invention may employ separate p-wells or a common p-well that operates as a back-gate to first and second NMOS transistors. Additionally, alternative embodiments may employ at least one back-gate that is a substrate of the integrated circuit 100.

Static noise margin (SNM) is generally increased by a stronger pull-up transistor while trip voltage ($V_{trip}$) is increased by a weaker pull-up transistor. Since the strength of a PMOS pull-up transistor can be adjusted by the n-well bias, the variation of SNM and $V_{trip}$ over temperature may be counter balanced by adjusting the n-well bias as a function of temperature to provide a relatively stronger PMOS pull-up transistor at higher temperature and a relatively weaker PMOS pull-up transistor at lower temperature.

The illustrated embodiment of the present invention employs an on-chip temperature detector to control the connection of bias to the n-wells 116, 121 of the SRAM memory cell 110. Embodiments switch the n-well bias for the SRAM memory cell 110 to reverse back-bias (high n-well) for low temperature and to substantially zero back-bias or even forward back-bias for high temperature. Temperature hysteresis around a specified temperature may be added to avoid frequent switching of the bias voltage at the specified temperature. Also, multiple steps in the n-well voltage as a function of temperature may be accommodated.

In one embodiment of the present invention, the voltage control circuit 145 provides the bias voltage to the first and second n-wells 116, 121 employing a fusible link or an EPROM. This embodiment may be employed to provide the bias voltage based on a characterization of the SRAM array shown or another memory array, in general. Alternatively, the bias voltage applied may be based on a transient or a local condition of the SRAM array.

For a low power mode of the integrated circuit 100, the power required for temperature sensing may be significant. In this case, the temperature sensing circuit 140 may be activated intermittently rather than employed continuously. If the integrated circuit 100 is not accessed in the low power mode, the temperature sensing circuit 140 may also be suspended for the duration of the low power mode. Optionally, the n-well bias may be set to optimize the minimum retention voltage of the integrated circuit 100 in the low power mode.

Figure 2:
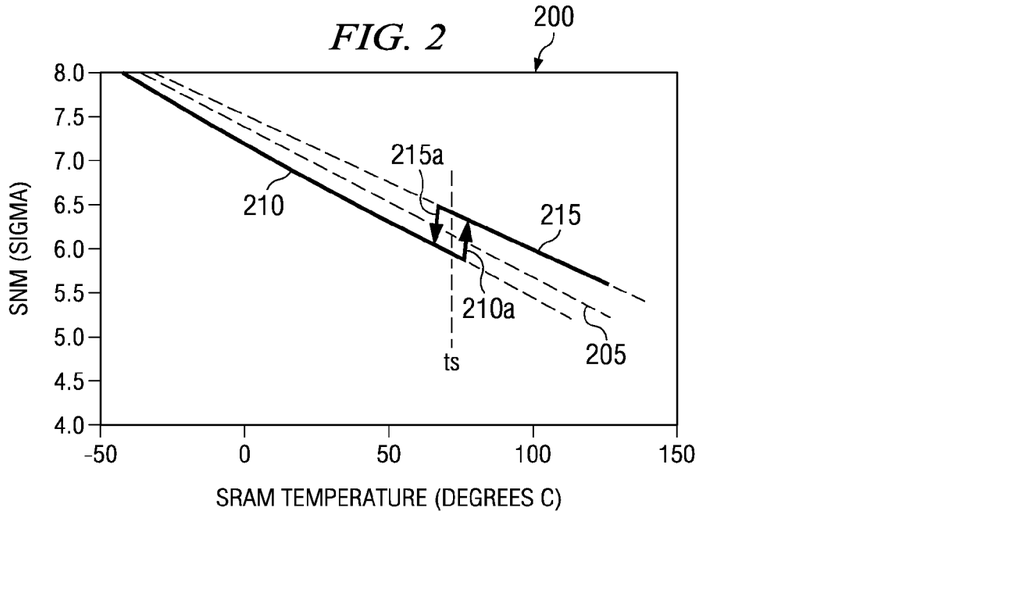
FIG. 2 illustrates a graph of an embodiment of SNM as a function of SRAM temperature employing bias voltages constructed in accordance with the principles of the present invention.

FIG. 2 illustrates a graph of an embodiment of SNM robustness as a function of SRAM temperature, generally designated 200, employing bias voltages constructed in accordance with the principles of the present invention. The graph 200 represents SNM robustness as a function of local signal-to-noise margin (SNM) SIGMA as may be provided by a thermostatic bias controller discussed with respect to FIG. 1. The graph 200 includes a lower temperature body bias voltage 210 of about 1.7 volts (0.5 volts above the nominal 1.2 volts operating voltage) and a higher temperature bias voltage 215 of about 0.7 volts (0.5 volts below that of the nominal operating voltage).

For SRAM temperatures below a specified temperature $t_s$, a bias voltage of 1.7 volts is applied to a back-gate such as the n-wells 116, 121 discussed with respect to FIG. 1. In the illustrated embodiment of FIG. 2, temperature hysteresis is employed. Therefore, for increasing SRAM temperatures, a bias voltage path 210-210a-215 provides bias voltage switching from 1.7 volts to 0.7 volts at a temperature that is a specified delta above the specified temperature $t_s$. Correspondingly, for decreasing SRAM temperatures, a bias voltage path 215-215a-210 provides bias voltage switching from 0.7 volts to 1.7 volts at a temperature that is a specified delta below the specified temperature $t_s$. This embodiment of bias voltage switching provides an SRAM cell robustness that remains above a target of five SIGMA.

Figure 3:
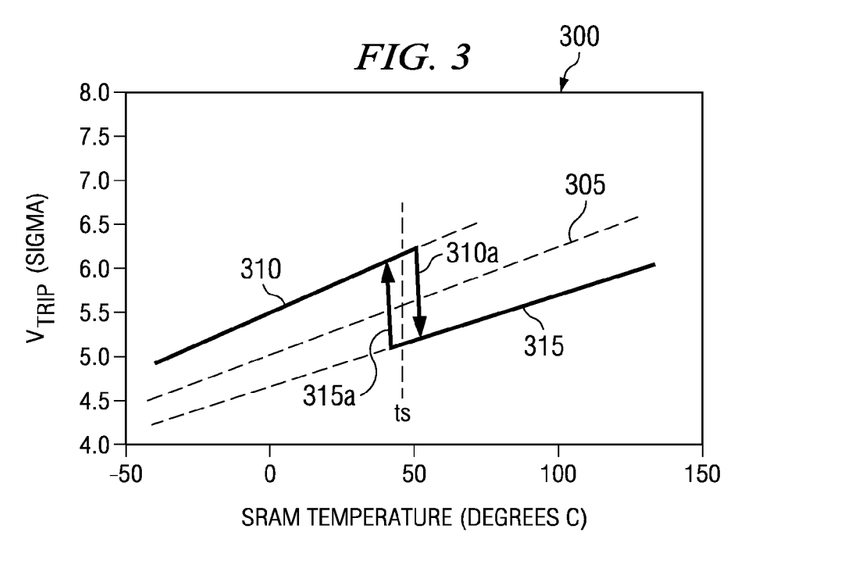
FIG. 3 illustrates a graph of an embodiment of $V_{trip}$ as a function of SRAM temperature employing bias voltages constructed in accordance with the principles of the present invention.

FIG. 3 illustrates a graph of an embodiment of $V_{trip}$ robustness as a function of SPAM temperature, generally designated 300, employing bias voltages constructed in accordance with the principles of the present invention. The graph 300 represents $V_{trip}$ robustness as a function of SNM SIGMA as may be provided by a thermostatic bias controller discussed with respect to FIG. 1. The graph 300 includes a lower temperature bias voltage 310 of about 1.7 volts and a higher temperature bias voltage 315 of about 0.7 volts that are shown with respect to a zero bias voltage 305 (zero volts body bias).

For SRAM temperatures below a specified temperature $t_s$, a bias voltage of 1.7 volts is applied to a back-gate such as the n-wells 116, 121 discussed with respect to FIG. 1. In the illustrated embodiment of FIG. 3, temperature hysteresis is also employed. Therefore, for increasing SPAM temperatures, a bias voltage path 310-310a-315 provides bias voltage switching from 1.7 volts to 0.7 volts at a temperature somewhat above the specified temperature $t_s$. Correspondingly, for decreasing SRAM temperatures, a bias voltage path 315-315a-310 provides bias voltage switching from 0.7 volts to 1.7 volts at a temperature somewhat below the specified temperature $t_s$. This embodiment of bias voltage switching provides a robustness that substantially remains above a target of five SIGMA.

Figure 4:
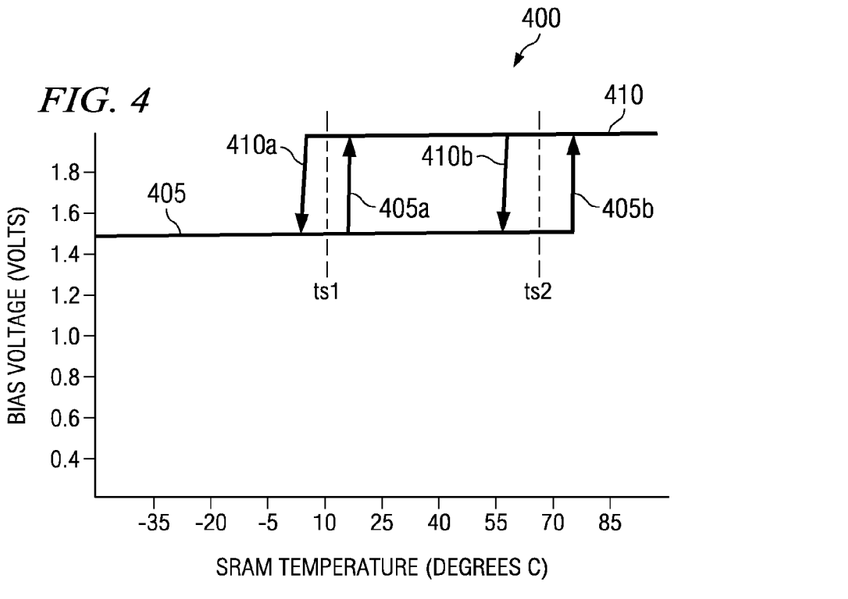
FIG. 4 illustrates a graph of an embodiment of bias voltage employing temperature hysteresis as a function of SRAM temperature for two examples of threshold voltage of a PMOS load transistor.

FIG. 4 illustrates a graph of an embodiment of bias voltage employing temperature hysteresis as a function of SRAM temperature, generally designated 400, for two examples of threshold voltage of a PMOS pull-up transistor. For SRAM temperatures below first or second specified temperatures $t_{s1}$, $t_{s2}$, a bias voltage of about 1.5 volts is applied to a back-gate such as the n-wells 116, 121 discussed with respect to FIG. 1. The first specified temperature $t_{s1}$ corresponds to a PMOS pull-up transistor having a standard threshold voltage, and the second specified temperature $t_{s2}$ corresponds to a PMOS pull-up transistor having a lower threshold voltage.

For increasing SRAM temperatures and the first specified temperature $t_{s1}$, a bias voltage path 405-405a-410 provides a bias voltage switching from about 1.5 volts to about 1.9 volts at a temperature somewhat above the first specified temperature $t_{s1}$. This corresponds to the standard threshold voltage case. For decreasing SRAM temperatures around the first specified temperature $t_{s1}$, a bias voltage path 410-410a-405 switches the bias voltage from about 1.9 volts to about 1.5 volts at a temperature somewhat below the first specified temperature $t_{s1}$.

For the lower threshold voltage case and increasing SRAM temperatures, a bias voltage path 405-405b-410 provides a bias voltage switching from about 1.5 volts to about 1.9 volts at a temperature somewhat above the second specified temperature $t_{s2}$. Then, for decreasing SRAM temperatures, a bias voltage path 410-410b-405 switches the bias voltage from about 1.9 volts to about 1.5 volts at a temperature somewhat below the second specified temperature $t_{s2}$.

Figure 5:
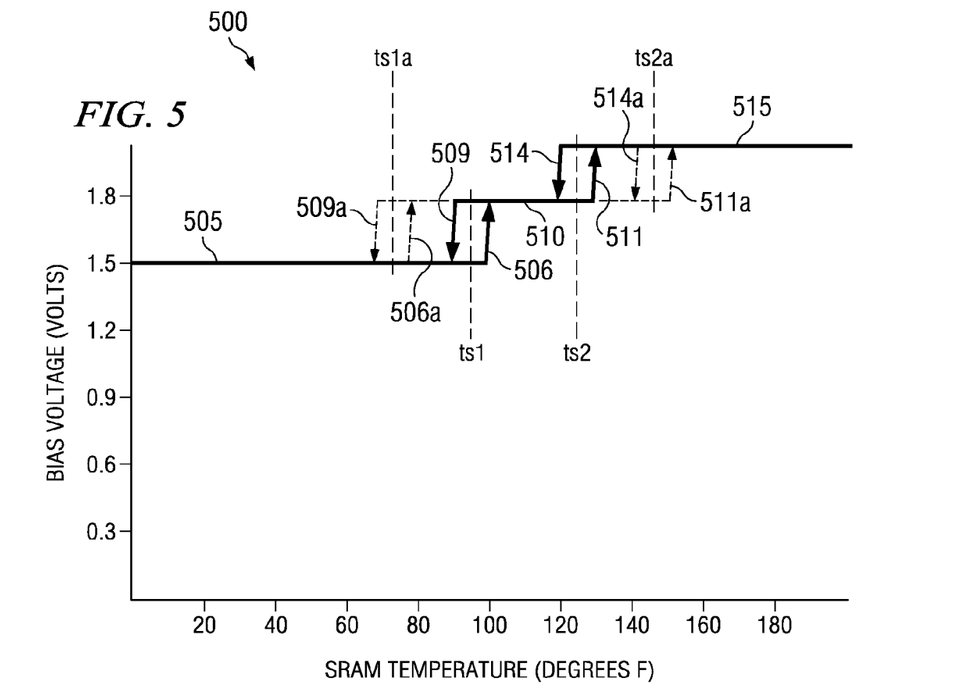
FIG. 5 illustrates a graph of an embodiment of a multiple-level bias voltage employing temperature hysteresis as a function of SRAM temperature and having a plurality of bias voltage steps corresponding to a plurality of specified temperatures.

FIG. 5 illustrates a graph of an embodiment of a multiple-level bias voltage, generally designated 500, employing temperature hysteresis as a function of SRAM temperature and having a plurality of bias voltage steps corresponding to a plurality of specified temperatures. In the illustrated embodiment, first and second specified temperatures $t_{s1}$, $t_{s2}$ are employed corresponding to three steps in bias voltage. However, other embodiments may employ additional bias voltage steps, as needed.

For increasing SRAM temperatures below the first and second specified temperatures $t_{s1}$, $t_{s2}$, a bias voltage of about 1.5 volts is applied to a back-gate such as the n-wells 116, 121 discussed with respect to FIG. 1. A bias voltage path 505-506-510-511-515 using temperature hysteresis is employed to provide first and second bias voltage steps to about 1.7 volts and 1.9 volts, as shown. Then, for decreasing SRAM temperatures, a bias voltage path 515-514-510-509-505 again using temperature hysteresis is employed to reverse the bias voltage steps. Use of bias voltage steps as described herein corresponds to a piece-wise linear increase and decrease in bias voltage. In an alternative embodiment, a continuous bias voltage may be employed as appropriate to a particular situation of SRAM temperature variation.

Generally, these temperature controlled back-biases may be applied to SRAM arrays in active or data retention modes, to header pull-down devices, and to general logic. However, to apply them to general logic, the logic timing has to be designed to function with the changing back-bias.

Additionally, the temperatures of switching may be adjusted at test depending on the process corner (e.g., switching to a lower n-well bias at a relatively higher temperature for strong NMOS/weak PMOS (SNWP) than for weak NMOS/strong PMOS (WNSP)). For example, alternative bias voltage paths 505-506a-510 or 510-511a-515 for increasing SRAM temperatures and 515-514a-510 or 510-509a-505 for decreasing SRAM temperatures may be employed using temperature hysteresis for alternative first and second specified temperatures $t_{s1a}$, $t_{s2a}$, as shown in FIG. 5.

In some cases and for some process corners, the n-well bias may not need to be adjusted as a function of temperature at all. This can be determined at final test and fuses or other non-volatile memory may be used to trim the temperatures of switching appropriately. Alternately, a voltage reference in the temperature sensing circuit may give the desired performance as a function of NMOS and PMOS transistor parameters.

Figure 6A:
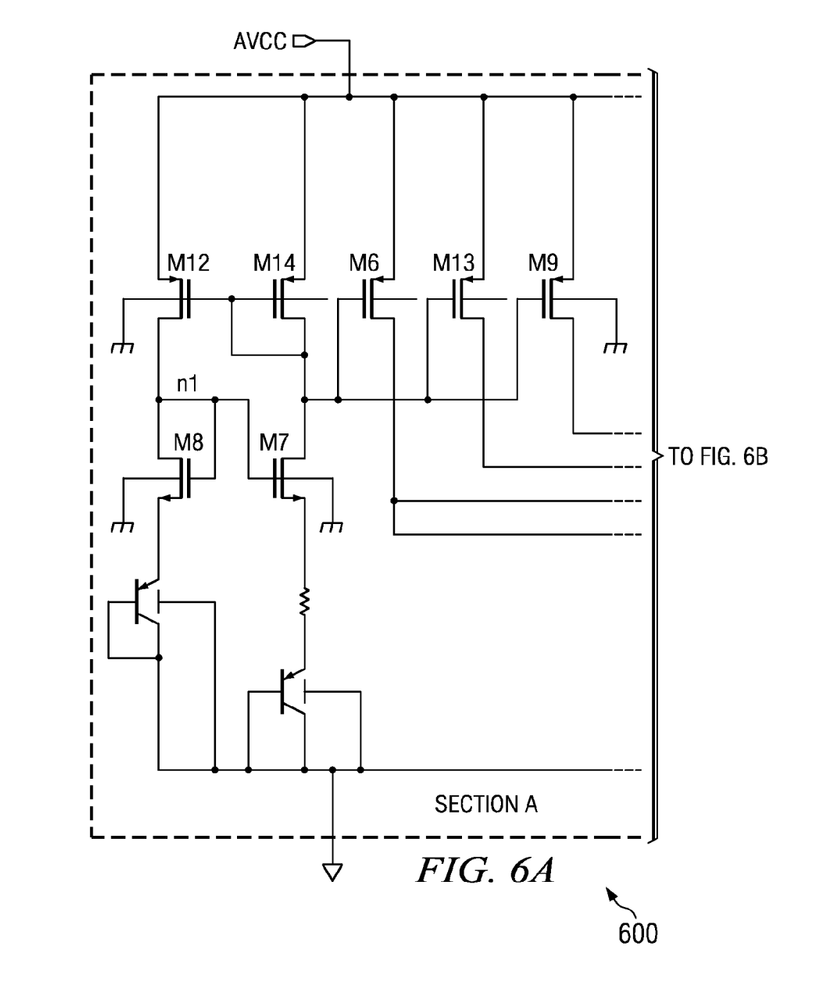
FIG. 6 illustrates a schematic of an embodiment of a thermostatic bias controller constructed according to principles of the present invention.
Figure 6B:
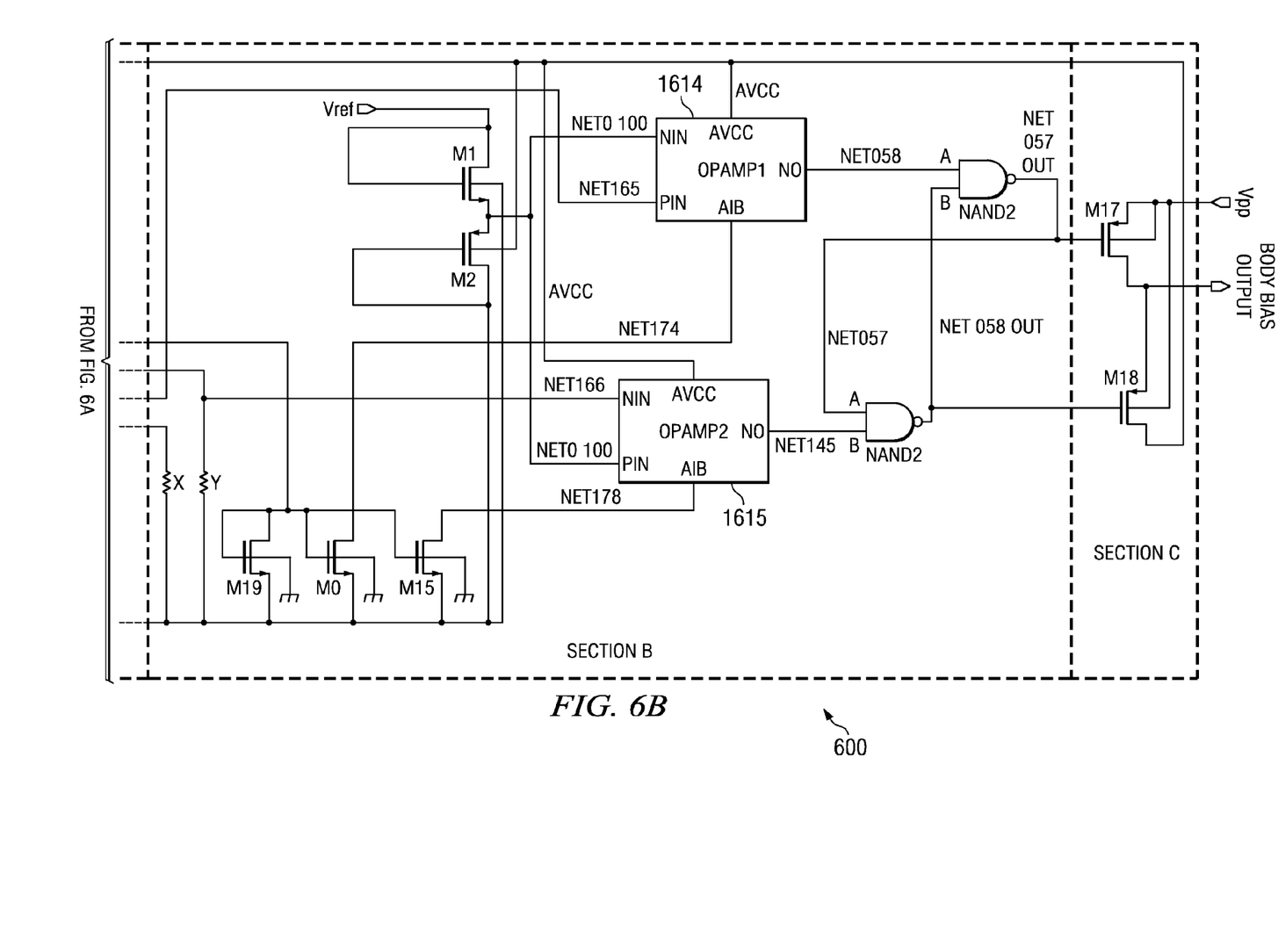

FIG. 6 illustrates a schematic of an embodiment of a thermostatic bias controller, generally designated 600, constructed according to the principles of the present invention. The thermostatic bias controller 600 provides an embodiment for enabling bias voltage control of a back-gate based on temperature of an SRAM array such as the n-wells 116, 121 associated with the SRAM array of FIG. 1. The thermostatic bias controller 600 allows switching between body biases employing temperature hysteresis.

The schematic of the thermostatic bias controller 600 is divided into sections A, B and C to facilitate discussion. Section A is a "current proportional to absolute temperature" circuit and is the basic core of a band gap circuit although not used in that capacity here. Outputs M6 and M13 (nodes X and Y) provide outputs that are temperature dependent. The nodes X and Y are actually used to generate voltages that vary with temperature in a differential sense and provide inputs to the positive inputs of first and second operational amplifiers OPAMP1, OPAMP2 in section B, as shown. A fixed reference voltage is supplied to the negative inputs of the first and second operational amplifiers OPAMP1, OPAMP2 for comparison purposes.

As the temperature-sensitive voltages on nodes X and Y increase or decrease with temperature, at some point a transition in the output voltages of the first and second operational amplifiers OPAMP1, OPAMP2 occurs. At this point, a flip-flop circuit formed by the two gates in section B switches the body bias output voltage of section C between VDD and VPP, which is about 1.8 volts.

As SRAM temperature rises, this switching occurs at a higher temperature employing temperature hysteresis. As the SRAM temperature cools to its original state, switching does not occur until a lower temperature is reached. This temperature level may also be used as part of an "OR" function to deactivate the temperature sensor (while the power or the temperature is high, the temperature sensor is normally activated). This may be modified for further power reduction by only enabling the temperature sensor intermittently when a standby mode for the SRAM array has been initiated.

Figure 7:
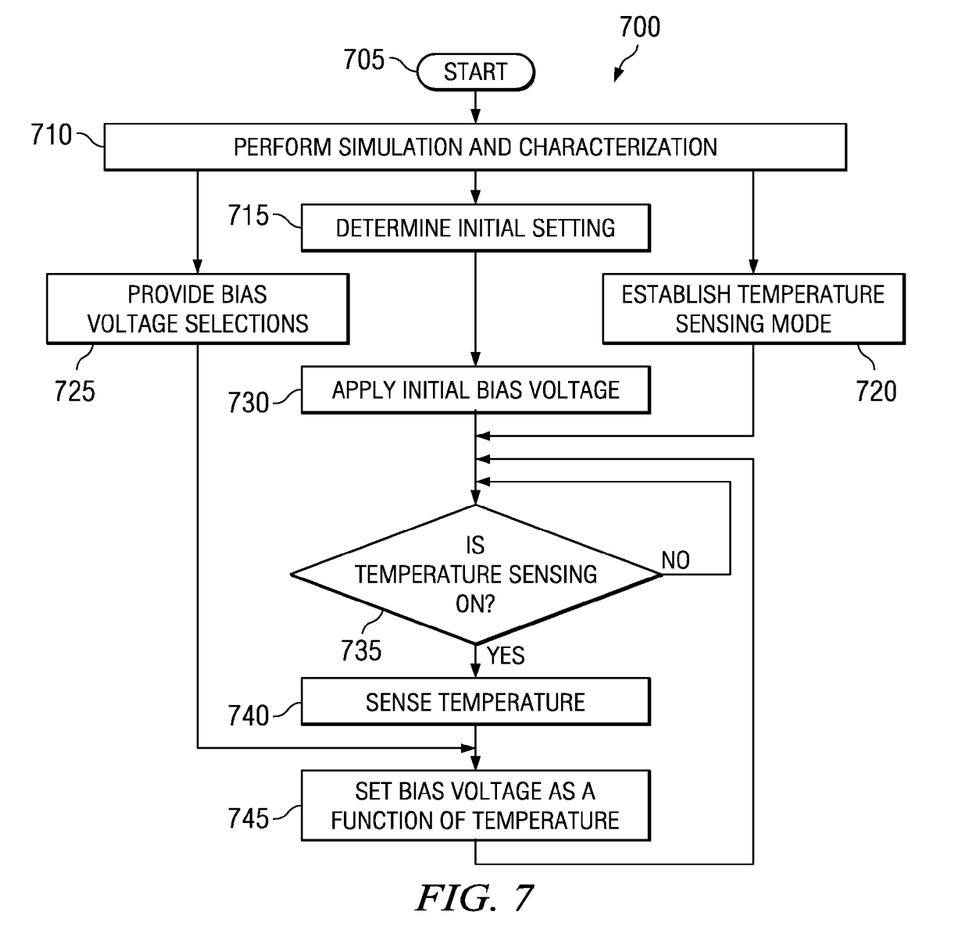
FIG. 7 illustrates a flow diagram of an embodiment of a method of operating a thermostatic bias controller carried out according to the principles of the present invention.

FIG. 7 illustrates a flow diagram of an embodiment of a method of operating a thermostatic bias controller, generally designated 700, carried out according to the principles of the present invention. The method 700 is for use with a memory array and starts in a step 705. The memory array may be embodied as an integrated circuit that employs at least one back-gate. Additionally, the memory array may employ several power modes including an active mode where it is fully-powered, a low power mode or a standby mode where it is powered down completely.

In one embodiment, the memory array is an SRAM array that employs a p-substrate, and the back-gate is an n-well containing a PMOS transistor, which is used as a pull-up transistor in a memory cell of the SRAM array. Alternatively, the back-gate may be a p-well or even a substrate of the memory array wherein appropriate MOS transistor polarities are employed.

Simulation and characterization of the memory array are performed in a step 710. Then, an initial bias voltage setting for the memory array is determined in a step 715, a temperature sensing mode is established in a step 720 and bias voltage selections are provided in a step 725. In one embodiment, the initial setting, temperature sensing mode and bias voltage selection may be provided employing hard-wired connections. For example, fusible links or a programmable device such as an EPROM may be employed. Alternatively, they may be provided during operation of the memory array or as a response to characterization results, as shown in the illustrated embodiment.

The temperature sensing mode established in the step 720 may be selected from several possibilities. These include a continuous mode, a periodic mode, an intermittent mode or a suspended mode where temperature of the memory array is not sensed. These temperature sensing modes may be employed independently, or they may be coordinated with a power mode of the memory array. For example, temperature may be sensed continuously for the active power mode, periodically or intermittently for the low power mode as well as intermittently or suspended altogether for the standby power mode.

In the illustrated embodiment, bias voltage selections provided in the step 725 are based on the simulation and characterization of the material or general transistor characteristics associated with the memory array performed in the step 710. Alternatively, the bias voltages provided may be based on a particular localized condition of the memory array or a transient condition associated with the memory array.

The bias voltages may be applied to at least one back-gate of the memory array employing a single transition temperature for both increasing and decreasing temperatures. Alternatively, the bias voltages may be applied employing temperature hysteresis around the single transition temperature for increasing and decreasing temperatures. Additionally, a single transition temperature may be employed using two bias voltages, or multiple transition temperatures may be employed corresponding to the use of multiple bias voltages.

An initial bias voltage is applied to at least one back-gate in the memory array in a step 730. Then, a decisional step 735 determines if temperature sensing of the memory array is currently activated. If temperature sensing is activated, the temperature is sensed in a step 740. Then, in a step 745 the bias voltage is set based on the temperature sensed in the step 740 employing either a single temperature transition or temperature hysteresis transitions for increasing and decreasing temperatures. The method 700 then reverts to the decisional step 735 for further determination as it also does if the decisional step 735 determines that temperature sensing is not activated.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order or the grouping of the steps is not a limitation of the present invention.

In summary, embodiments of the present invention employing a thermostatic bias controller, a method of operating a thermostatic bias controller and an integrated circuit employing the controller or the method have been presented. Advantages include providing a temperature-dependent bias voltage that allows an optimization between SNM and $V_{trip}$ over a temperature operating range. Generally, SNM is enhanced by a stronger pull-up transistor while $V_{trip}$ is enhanced by a weaker pull-up transistor. Since the strength of a PMOS pull-up transistor can be adjusted by its n-well bias, variations of SNM and $V_{trip}$ over temperature may be counterbalanced by adjusting the n-well bias as a function of temperature to give a relatively stronger PMOS pull-up transistor at higher temperature and a weaker one at lower temperature.

An on-chip temperature detector is employed to enable the connection of bias to the n-well of the SRAM array of FIG. 1. In one embodiment, the SRAM array n-well bias is switched to reverse back-bias for low temperature and to a substantially zero back-bias or forward back-bias for high temperature. In another embodiment, temperature hysteresis may be added to avoid frequent switching (i.e., dithering) of the bias voltage. In an alternative embodiment, multiple steps in n-well voltage may be provided as a function of temperature.

For a low power operating mode, the power required for temperature sensing may be significant. In this case, the temperature sensing circuitry may be turned on intermittently rather than continuously. If the SRAM array is not accessed in a low power mode, temperature sensing may be turned off for the duration of the low power mode. As an option, the n-well bias voltage may be set to optimize the minimum retention voltage of the SRAM array in the low power mode.

Those skilled in the art to which the invention relates will appreciate that other and further additions, deletions, substitutions and modifications may be made to the described embodiments without departing from the scope of the invention.

What is claimed is:

1. A thermostatic bias controller for use with a memory array, comprising:
   a temperature sensing circuit configured to sense a temperature associated with the memory array; and
   a voltage control circuit coupled to the temperature sensing circuit and configured to provide, during an active power mode or a low power mode, a bias voltage to a back-gate of at least one pull-up transistor of a memory cell of the memory array based on the temperature and employing a bias voltage hysteresis.

2. The controller as recited in claim 1 wherein the memory array is a static random access memory (SRAM) array.

3. The controller as recited in claim 1 wherein the bias voltage is set to a first voltage when the temperature is less than a specified temperature and is set to a second voltage when the temperature is at least the specified temperature.

4. The controller as recited in claim 3 wherein the specified temperature is a first specified temperature, and the bias voltage is set to a third voltage when the temperature is at least a second specified temperature, which is greater than the first specified temperature.

5. The controller as recited in claim 3 wherein the bias voltage hysteresis is employed around the specified temperature.

6. The controller as recited in claim 1 wherein providing the bias voltage is based on sensing the temperature continuously or intermittently.

7. The controller as recited in claim 1 wherein providing the bias voltage corresponds to sensing the temperature based on a power mode of the memory array, the power mode comprising one of a high power plus high performance mode or a low power plus low performance mode.

8. The controller as recited in claim 4 wherein the bias voltage hysteresis is employed around the first specified temperature and also around every at least the second specified temperature.

9. The controller as recited in claim 1 wherein providing the bias voltage is based on a transient or a local condition of the memory array.

10. The controller as recited in claim 1 wherein providing the bias voltage is based on a characterization of the memory array.

11. The controller as recited in claim 10 wherein providing the bias voltage is based on a state of a fusible link or an EPROM.

12. A method of operating a thermostatic bias controller for use with a memory array, comprising:
    sensing a temperature associated with the memory array; and
    providing, during an active power mode or a low power mode, a bias voltage to a back-gate of at least one pull-up transistor of a memory cell of the memory array based on the temperature and employing a bias voltage hysteresis.

13. The method as recited in claim 12 wherein the memory array is a static random access memory (SRAM) array.

14. The method as recited in claim 12 wherein the bias voltage is set to a first voltage when the temperature is less than a specified temperature and is set to a second voltage when the temperature is at least the specified temperature.

15. The method as recited in claim 14 wherein the specified temperature is a first specified temperature, and the bias voltage is set to a third voltage when the temperature is at least a second specified temperature, which is greater than the first specified temperature.

16. The method as recited in claim 14 wherein the bias voltage hysteresis is employed around the specified temperature.

17. The method as recited in claim 12 wherein the providing the bias voltage is based on sensing the temperature continuously or intermittently.

18. The method as recited in claim 12 wherein the providing the bias voltage corresponds to sensing the temperature based on a power mode of the memory array.

19. The method as recited in claim 15 wherein the bias voltage hysteresis is employed around the first specified temperature and also around every at least the second specified temperature.

20. The method as recited in claim 12 wherein the providing the bias voltage is based on a transient or a local condition of the memory array.

21. The method as recited in claim 12 wherein the providing the bias voltage is based on a characterization of the memory array.

22. The method as recited in claim 21 wherein the providing the bias voltage is based on a state of a fusible link or an EPROM.

23. An integrated circuit, comprising:
    a memory array employing a back-gate of at least one pull-up transistor of a memory cell;
    a thermostatic bias controller coupled to the back-gate, including:
    a temperature sensing circuit that senses a temperature associated with the memory array, and
    a voltage control circuit coupled to the temperature sensing circuit and configured to provide, during an active power mode or a low power mode, a bias voltage to the back-gate of at least one pull-up transistor of a memory cell of the memory array based on the temperature and employing a bias voltage hysteresis; and
    a memory control portion that provides read/write access for the memory array.

24. The integrated circuit as recited in claim 23 wherein the memory array is a static random access memory (SRAM) array.

25. The integrated circuit as recited in claim 23 wherein the back-gate of the memory array is an n-well.

26. The integrated circuit as recited in claim 23 wherein the back-gate of the memory array is a p-well.

27. The integrated circuit as recited in claim 23 wherein the back-gate of the memory array is a substrate.

28. The integrated circuit as recited in claim 23 wherein the bias voltage is set to a first voltage when the temperature is less than a specified temperature and is set to a second voltage when the temperature is at least the specified temperature.

29. The integrated circuit as recited in claim 28 wherein the specified temperature is a first specified temperature, and the bias voltage is set to a third voltage when the temperature is at least a second specified temperature, which is greater than the first specified temperature.

30. The integrated circuit as recited in claim 28 wherein the bias voltage hysteresis is employed around the specified temperature.

31. The integrated circuit as recited in claim 23 wherein providing the bias voltage is based on sensing the temperature continuously or intermittently.

32. The integrated circuit as recited in claim 23 wherein providing the bias voltage corresponds to sensing the temperature based on a power mode of the memory array.

33. The integrated circuit as recited in claim 29 wherein the bias voltage hysteresis is employed around the first specified temperature and also around every at least the second specified temperature.

34. The integrated circuit as recited in claim 23 wherein providing the bias voltage is based on a transient or a local condition of the memory array.

35. The integrated circuit as recited in claim 23 wherein providing the bias voltage is based on a characterization of the memory array.

36. The integrated circuit as recited in claim 35 wherein providing the bias voltage is based on a state of a fusible link or an EPROM.

37. A thermostatic bias controller for use with a memory array, comprising:
   a temperature sensing circuit configured to sense a temperature associated with the memory array; and
   a voltage control circuit coupled to the temperature sensing circuit and configured to provide a bias voltage to a back-gate of at least one pull-up transistor of a memory cell of the memory array based on the temperature and employing a bias voltage hysteresis;
   wherein the bias voltage is set to a first voltage when the temperature is less than a specified temperature and is set to a second voltage when the temperature is at least the specified temperature, and further wherein the bias voltage hysteresis is employed around the specified temperature.

38. A thermostatic bias controller for use with a memory array, comprising:
   a temperature sensing circuit configured to sense a temperature associated with the memory array; and
   a voltage control circuit coupled to the temperature sensing circuit and configured to provide a bias voltage to a back-gate of at least one pull-up transistor of a memory cell of the memory array based on the temperature and employing a bias voltage hysteresis;
   wherein providing the bias voltage is based on sensing the temperature intermittently.

* * * * *